United States Patent [19]

DiLorenzo et al.

[11] 4,106,959
[45] Aug. 15, 1978

[54] PRODUCING HIGH EFFICIENCY GALLIUM ARSENIDE IMPATT DIODES UTILIZING A GAS INJECTION SYSTEM

[75] Inventors: James Vincent DiLorenzo, Piscataway; William Charles Niehaus, Murray Hill; Lawrence John Varnerin, Jr., Watchung, all of N.J.

[73] Assignee: Bell Telephone Laboratories, Incorporated, Murray Hill, N.J.

[21] Appl. No.: 702,393

[22] Filed: Jul. 6, 1976

Related U.S. Application Data

[62] Division of Ser. No. 538,082, Jan. 2, 1975, Pat. No. 3,986,192.

[51] Int. Cl.² .................. H01L 21/205; H01L 29/207; H01L 29/48
[52] U.S. Cl. ............................. 148/175; 29/569 R; 29/574; 148/33.5; 331/107 G; 357/13; 357/15; 357/89; 357/90
[58] Field of Search ............... 148/175, 33.5; 357/13, 357/15, 89, 90; 331/107 G; 29/569, 574

[56] References Cited

U.S. PATENT DOCUMENTS

| | | | |
|---|---|---|---|
| 3,668,555 | 6/1972 | Kasperkovitz | 357/89 X |
| 3,721,583 | 3/1973 | Blakeslee | 148/175 X |
| 3,808,555 | 4/1974 | Goedbloed | 357/13 X |
| 3,836,990 | 9/1974 | Harth | 357/13 X |
| 3,885,061 | 5/1975 | Corboy et al. | 148/175 X |
| 3,896,473 | 7/1975 | DiLorenzo et al. | 357/13 X |
| 3,896,479 | 7/1975 | DiLorenzo et al. | 357/71 |
| 3,904,449 | 9/1975 | DiLorenzo et al. | 148/175 |

OTHER PUBLICATIONS

Salmer et al., "Theoretical and Experimental—GaAs IMPATT—Efficiency" J. Appl. Physics, vol. 44, No. 1, Jan. 1973, pp. 314–324.

*Primary Examiner*—R. Dean
*Assistant Examiner*—W. G. Saba
*Attorney, Agent, or Firm*—Peter V. D. Wilde

[57] ABSTRACT

The operating frequency of an IMPATT diode depends on the width of the depletion region formed during operation. The frequency of high efficiency GaAs IMPATT diodes comprising a non-uniformly doped depletion region contacted by a rectifying barrier can be more precisely fixed by forming a "clump" of charge at exactly the depth below the surface contacted by the rectifying barrier corresponding to the desired depletion region.

6 Claims, 7 Drawing Figures

PRODUCING HIGH EFFICIENCY GALLIUM ARSENIDE IMPATT DIODES UTILIZING A GAS INJECTION SYSTEM

This application is a division of application Ser. No. 538,082, filed Jan. 2, 1975, now U.S. Pat. No. 3,986,192, issued Oct. 12, 1976.

BACKGROUND OF THE INVENTION

1. Field of the Invention

The invention relates to semiconductor microwave diodes and, more particularly, to more precisely defining the operating frequency of high efficiency GaAs Schottky barrier diodes having non-uniformly doped depletion region.

2. Description of the Prior Art

There is considerable interest currently in solid state microwave energy sources. Such sources promise to be more compact and less expensive, and to have considerably longer life than microwave tubes.

Among the most promising forms of solid state microwave sources is the impact-avalanche transit-time (IMPATT) diode disclosed in U.S. Pat. Nos. 2,899,646 and 2,899,652, which issued to W. T. Read, Jr. on Aug. 11, 1959. A characteristic of such a diode is a multi-zone semiconductive element which, when operating, includes a depletion region comprising an avalanche region and a drift region. A rectifying barrier, such as a Schottky barrier, contacts the avalanche region. A dynamic negative resistance is achieved by introducing an appropriate transit time to avalanching carriers in their travel across the drift region.

Early investigations have centered on increasing both the output power and the frequency of operation of these devices. More recent studies have concentrated on increasing the output efficiency, which, for GaAs IMPATT diodes, has typically ranged from about 10 percent to 15 percent of the input power.

It is now known that high efficiency (about 25 percent to 35 percent) GaAs IMPATT diodes may be obtained by more precisely defining the avalanche region. This is realized by forming a region of high doping level, or "clump" of charge, at a particular depth below the Schottky barrier contact, within that part of the body of the device that normally forms the depletion region when in operation. In this description, that region is termed the active layer. The location of the charge clump is dictated by desired operating frequency and efficiency considerations.

A continuing problem, however, has involved attempts to define more precisely the output frequency of the device. This frequency depends on the width of the depletion region, and is easily affected by material parameter variations. For example, calculations have shown that relatively small (about 5 percent) changes in impurity content and position of the charge clump result in unacceptably large (about 11 percent) deviations in the operating frequency.

SUMMARY OF THE INVENTION

In accordance with the invention, the frequency of a GaAs IMPATT diode is fixed by forming a second region of high doping level, or "stop clump", at the depth below the surface corresponding to a desired depletion depth. For example, for an 11 GHz device, this depth is 3.5 $\mu$m; for a 6 GHz device, the depth is 6.5 $\mu$m. As a consequence, variation in the frequency of IMPATT diodes due to material parameter variations within a GaAs slice is minimized.

A preferred embodiment is directed to forming the stop clump by using a gas injection valve to inject a known volume of a known concentration of the doping gas at a known pressure into the reaction chamber during chemical vapor deposition epitaxial growth of the active layer.

DETAILED DESCRIPTION OF THE INVENTION

The description that follows is given in terms of a GaAs Schottky barrier IMPATT diode capable of operating in the microwave frequency range of about 6 GHz to 12 GHz. The inventive structure disclosed, however, can be employed over other frequency ranges as well.

Figure 1A:
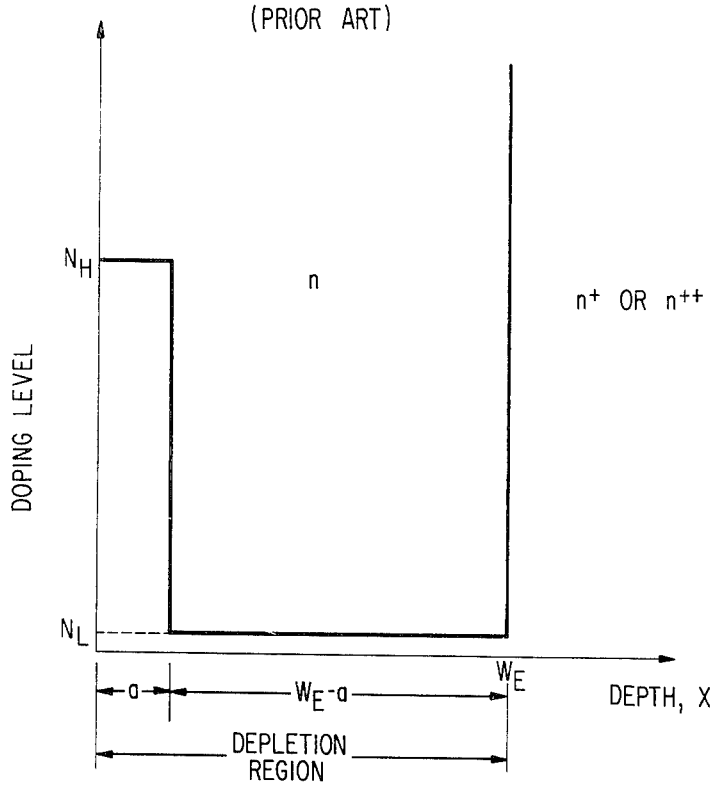
FIGS. 1A and 1B, on coordinates of doping level and distance into the active layer as measured from a rectifying contact, are plots of ideal non-uniform doping profiles of high efficiency GaAs IMPATT diodes.
Figure 1B:
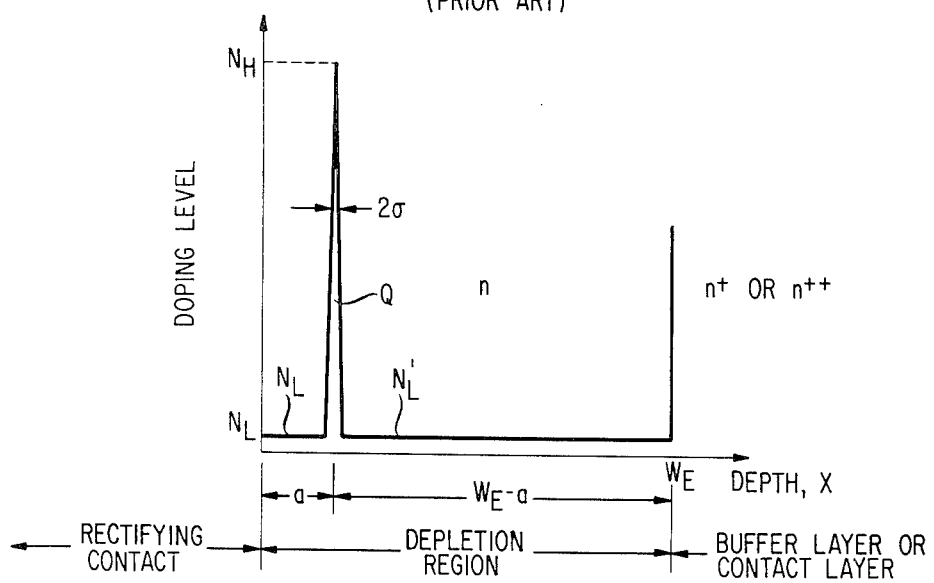

IMPATT diodes with depletion regions having a variety of non-uniform doping profiles have been shown to yield high efficiency microwave power sources; see Vol. 44, *Journal of Applied Physics*, pp. 314–324, 1973. Examples of such structures are illustrated in FIG. 1. FIG. 1A depicts a two-step doping profile, or hi-lo modified Read profile. The hi-lo doping profile in FIG. 1A is characterized by a high doped layer $N_H$ of thickness $a$ and by a low doped layer $N_L$ of thickness $W_E$-$a$, where $W_E$ is the physical thickness of the active layer. FIG. 1B depicts a two-step field profile, or lo-hi-lo modified Read doping profile. The lo-hi-lo doping profile in FIG. 1B is characterized by a high doped layer $N_H$, or "clump", containing charge Q at a mean position $a$ from the rectifying barrier and by low doped layers $N_L$ and $N_L'$ on both sides of the high doped layer, where $N_L$ and $N_L'$ may or may not be equal. The width of this high doped region is $2\sigma$.

The plots show a depletion region, or space charge region, of width W, comprising an avalanche region $a$ and a drift or transit region W-$a$. Depending on the operating conditions of the device, W may be equal or less than width $W_E$. The increase in doping concentration at $x = a$ serves to define the avalanche region more precisely than is possible with uniform doping across the depletion region, as the above reference indicates. For optimum device properties, the width of the avalanche region should range from about 4 percent to 16 percent of the width of the depletion region.

For both a hi-lo and a lo-hi-lo profile, $a$ ranges from about 0.2 $\mu$m to 1.0 $\mu$m, as measured from the surface contacted by the rectifying barrier. For a lo-hi-lo profile, the width $2\sigma$ of the charge clump ranges from about 100 Angstroms to 0.5 μm as measured at 60 percent of $N_H$, assuming a Gaussian distribution.

Three parameters are important for efficient oscillations: (1) the width of the avalanche region $a$, (2) the amount of doping of the drift region $N_L$ and (3) the amount of charge Q present near the surface (for a hi-lo profile, $Y_Q = a\, N_H$; for a lo-hi-lo profile, $Q \simeq 2\sigma N_H$). For optimum device properties, the measured value of Q should range from about $2 \times 10^{12}\, \text{cm}^{-2}$ to $3.5 \times 10^{12}\, \text{cm}^{-2}$. In order to maximize the efficiency of the device, the location of the highly doped region and the carrier concentration in that region must be carefully controlled. As shown in the above reference, a theoretical operating efficiency for GaAs IMPATT diodes having a hi-lo profile is 33.9 percent of the input power, while the theoretical efficiency for a lo-hi-lo profile is 32.3 percent of the input power.

The principle factor in obtaining an acceptable yield of devices with high efficiency performance at a specific frequency, $f$, is the uniformity and specific value of device space charge width W at the onset of avalanche. The variations in space charge width $\Delta W$ and in device frequency $\Delta f$ are related as $$\frac{\Delta f}{f} = -\frac{\Delta W}{W} \qquad (1)$$

Thus, the frequency $f$ of the device depends on the width of the depletion region, $W$. For a hi-lo profile, $W$ depends on the values of $N_H$, $a$, and $N_L$. For a lo-hi-lo profile, $W$ depends on the values of $Q$, $a$, and $N_L$. Thus, $W$ is sensitive to variations in these material parameters. It should be noted that for non-uniformly doped depletion regions, $W$ is more sensitive by at least a factor of 2 to material parameter variations than for uniformly-doped depletion regions. Consequently, for diodes having non-uniformly doped depletion regions, both dc static properties (breakdown voltage, capacitance per unit area, etc.) and microwave properties (frequency, output power, efficiency, etc.) of the device are easily affected. However, and in accordance with the invention, $W$, and thus the operating frequency $f$, can be fixed by placing a clump of charge, termed here a "stop clump", at exactly the depth below the surface corresponding to a desired depletion region (3.5 μm for an 11 GHz device; 6.5 μm for a 6 GHz device).

Figure 2A:
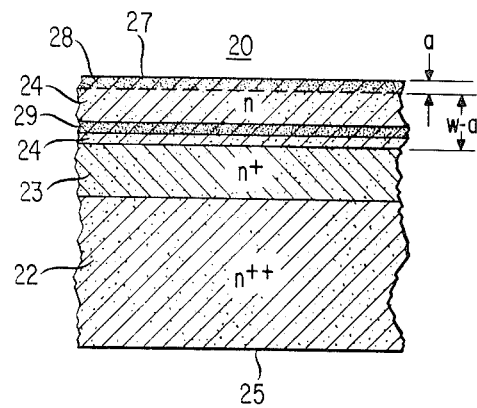
FIGS. 2A and 2B are front elevational views in cross section of a GaAs slice including a substrate and two epitaxial layers in which one of the epitaxial layers is doped in accordance with the invention.
Figure 2B:
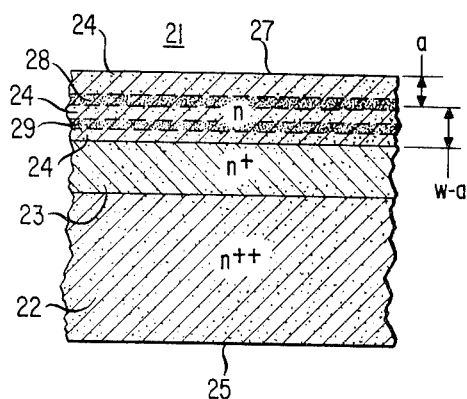

For purposes of illustration, a hi-lo structure 20 is shown in FIG. 2A and a lo-hi-lo structure 21 is shown in FIG. 2B. The structures comprise epitaxial films 23 and 24 sequentially deposited on a highly doped substrate 22, or "contact" layer, having a carrier concentration of about $10^{18}\, \text{cm}^{-3}$ and designated $n^{++}$. A first epitaxial "buffer" layer 23, having a carrier concentration of about $4 \times 10^{17}\, \text{cm}^{-3}$ and designated $n^+$, is formed on one surface of the substrate. A second epitaxial "active" layer 24, having a carrier concentration of about $10^{15}\, \text{cm}^{-3}$ and designated $n$, is formed on the surface of the buffer layer, and includes the depletion region. Details of this structure are described in Proceedings of the IEEE, Vol. 59, No. 8, August, 1971, pp. 1212–1215, and thus do not form a part of this invention. An IMPATT device may be fabricated, as is well-known in the art, by forming either an ohmic contact or rectifying contact on the exposed surface 25 of the substrate 22 and a rectifying barrier, such as a Schottky barrier contact, on the exposed surface 27 of the active layer 24. An ultrathin layer 28 formed during the deposition of the active layer 24, comprises the highly doped region for increasing the efficiency of the device. A second ultrathin layer 29, also formed during the deposition of the active layer, comprises the "stop clump" for better defining the operating frequency of the device, in accordance with the invention.

While the buffer layer (or, in the absence of a buffer layer, the contact layer) may, in principle, serve to define the depletion width W and hence the operating frequency $f$, it appears that the growth techniques presently available in the art permit better control over locating the position of the stop clump. Apparently as a result of diffusion effects, control over the location of the buffer layer-active layer boundary is more difficult to attain.

The amount of change $Q_S$ most desirable in the stop clump is determined by (a) the maximum solubility of the dopant in the epitaxial host material and (b) the total Q (the total change in both hi and lo regions) in the remainder of the depletion region. Consistent with these considerations, $Q_S$ advantageously may range from about $1 \times 10^{12}\, \text{cm}^{-2}$ to $3.5 \times 10^{12}\, \text{cm}^{-2}$.

The width of the stop clump is constrained by two considerations. For too high a value, the control over frequency is lost. The lower value is limited by practical problems relating to forming thin layers. Consistent with these considerations, the width of the stop clump may range from about 100 Angstroms to 0.5 μm, as measured at 60 percent of the maximum doping level, assuming a Gaussian distribution.

Figure 3:
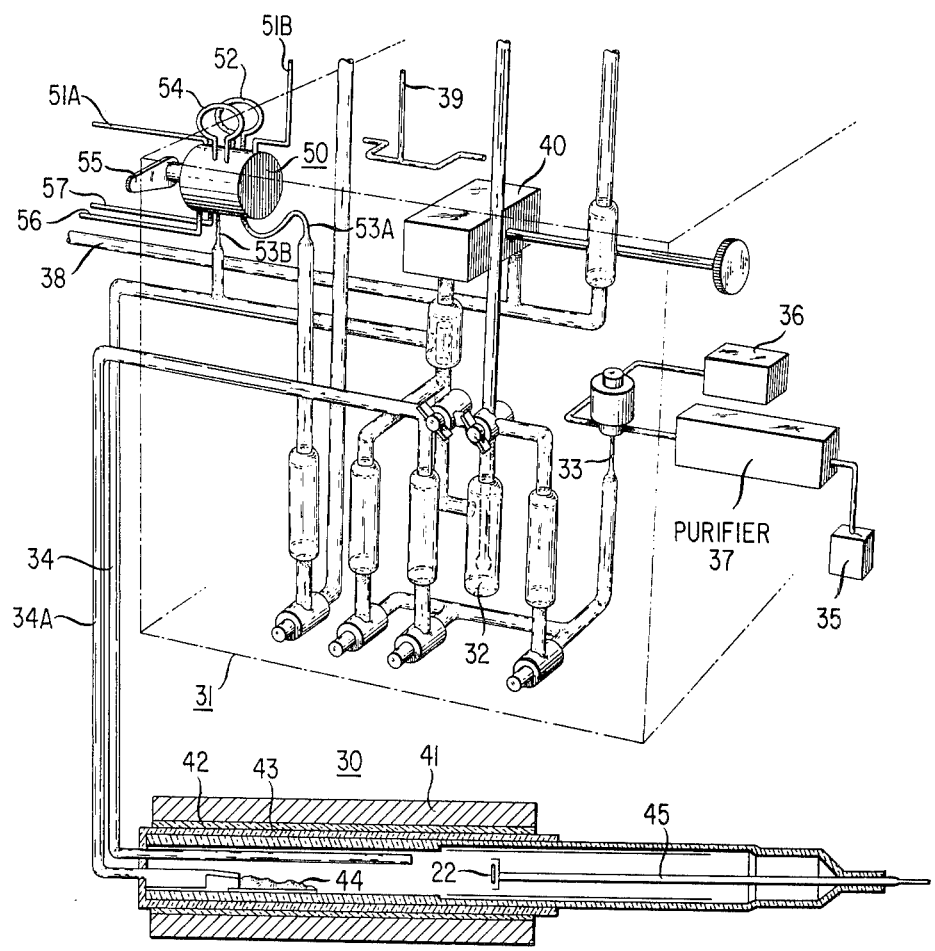
FIG. 3 is a schematic view of a typical apparatus suitable for use in the practice of the present invention.

In FIG. 3, a schematic representation of apparatus 30 conveniently used in the practice of the invention is shown. A more detailed description of this system is available elsewhere; see, e.g., J. V. DiLorenzo, U.S. Pat. No. 3,762,945, issued Oct. 2, 1973, and Vol. 17, *Journal of Crystal Growth*, pp. 189–206, 1972. A bubbler system 31 includes a reservoir of arsenic trichloride 32 and conduit means 33, 34, and 34A, respectively, for admitting and removing hydrogen and helium to and from the bubbler system. The system also includes a source of hydrogen 35, a source of helium 36, a hydrogen purifier 37, means 38 for admitting a dopant to the bubbler system, means 39 for admitting nitrogen to the bubbler system, and variable leak valve 40. The apparatus employed also includes a furnace 41 containing a muffle tube 42 and a quartz reaction tube 43.

In the operation of the growth process, heating of the reaction chamber is initiated, hydrogen from source 35 being diffused through palladium-silver membranes in purifier 37 and flowed through control valves in the bubbler system to arsenic trichloride reservoir 32. Hydrogen serves as a carrier gas and transports the arsenic trichloride to reaction chamber 43. Additionally, the hydrogen flow serves as a dilute control for the arsenic trichloride flow and for dopant transfer to the reaction chamber. Reservoir 32 is maintained at a temperature within the range of 15° C to 25° C during growth, and the flow rate of hydrogen is maintained within the range of 300 cm³/min to 400 cm³/min.

Before initiating the vapor transport process, a source of gallium 44 is introduced into chamber 43 which also includes a holder 45, on which is mounted a suitable substrate 22, discussed previously in connection with FIG. 2. A solid source of GaAs may alternatively be employed in place of Ga.

The substrate may be tellurium-, selenium-, or silicon-doped $n^{++}$ GaAs, manifesting a resistivity of about 0.003 ohm-cm. These materials are fabricated using techniques well-known to those skilled in the art.

Turning again to the operation of the process, heating of the reaction chamber is continued until the gallium attains a temperature of 760° C to 810° C and the substrate a temperature of 725° C to 760° C, at which point epitaxial growth is initiated at a rate within the range of 0.05 μm/min to 0.3 μm/min. Growth of epitaxial layer 23 of gallium arsenide (FIG. 2) ranging in thickness from 2 μm to 6 μm is continued, the carrier concentration being maintained at a value within the range of $1 \times 10^{17} \text{cm}^{-3}$ to $1 \times 10^{18} \text{cm}^{-3}$ by the addition to the reaction system of a suitable dopant, typically sulphur, selenium, and the like, via the variable leak valve 40. The thickness and carrier concentration of epitaxial layer 23 are dictated by considerations relating to the desired resistivity of the deposited layer.

Helium may be used, as taught in U.S. Pat. No. 3,762,945, issued Oct. 2, 1973 to J. V. DiLorenzo, to transport additional $AsCl_3$ to etch either the substrate 22 or the first epitaxial layer 23 in order to obtain a smooth uniform transition between the layers and to prevent the formation of any interfacial layers.

Growth of a second epitaxial layer 24 of gallium arsenide (FIG. 2) ranging in thickness from 4 μm to 8 μm is carried out as above, with the carrier concentration $N_L$ being maintained at a value within the range of $1 \times 10^{15} \text{cm}^{-3}$ to $1 \times 10^{16} \text{cm}^{-3}$, again introducing a suitable dopant through the variable leak valve 40. The thickness and carrier concentration of epitaxial layer 24 is dictated by considerations relating to the desired operating frequency of the finished device, with lower operating frequency associated with greater thickness of layer 24 and lower carrier concentration $N_L$.

There are a variety of techniques that may be employed where it is desired to form highly doped regions 28 and 29. For example, for relatively wide highly doped regions, the variable leak valve 40 may be employed. Alternatively, at an appropriate time during the growth of epitaxial layer 24, a known volume of a known concentration of the dopant at a known pressure is instantaneously injected into the reaction chamber. This technique is useful for forming relatively narrow highly doped regions and is conveniently achieved by using, for example, commercially available 100 ppm to 1000 ppm $H_2S/H_2$ as the dopant source and a gas injection valve 50. The dopant gas continuously flows at a constant rate through a tube 51A to exhaust to the atmosphere through tube 51B. A portion of the tube defines a constant volume region 52 between two switching points interior the valve. The carrier gas flows through a second tube 53A to the reaction chamber 43 via tube 53B. A portion of the second tube may also define a constant volume region 54 between two switching points interior the valve. At an appropriate time, both switching points are inverted by handle 55 so that the carrier gas sweeps out the dopant gas trapped in the constant volume region 52 into the reaction chamber. The valve mechanism is surrounded by an inert gas, such as helium, which is introduced via tube 56 and which exhausts to the atmosphere via tube 57.

From the gas law, $$m = (RT/PV), \quad (2)$$

where $m$ is the amount of the dopant in moles, R the gas constant, T the temperature in degrees Kelvin, P the pressure of the dopant gas, and V the volume of the dopant gas. By using a known concentration of the dopant (e.g., 1000 ppm $H_2S/H_2$) flowing at a known pressure, then the widths of the highly doped regions 28 and 29 depend only on (1) the growth rate of the second epitaxial layer 24 and (2) the volume of dopant gas injected into the carrier gas stream as determined by the constant volume region 52. Widths of highly doped regions ranging from about 100 Angstroms to 700 Angstroms are easily obtainable by this technique. If a portion of the second tube 53 also defines a constant volume region 54, then repeated switching may be performed to obtain a series of highly doped regions in the epitaxial layer, without interrupting the growth of the layer.

Use of the technique permits formation of the highly doped regions 28 and 29 (FIGS. 2A and 2B). The growth of the second epitaxial layer continues uninterrupted until a final desired thickness is obtained, to form the lo-hi-lo modified Read structure of FIG. 2B. Alternatively, growth may be stopped after the formation of region 28 to form the hi-lo modified Read structure of FIG. 2A. Other non-uniformly doped structures may also be fabricated. The slice is then further processed to fabricate an IMPATT diode by methods well-known in the art, as mentioned earlier.

The foregoing CVD reaction has been described in terms of the $Ga/AsCl_3/H_2$ disproportionation reaction, where etching of the substrate 22 or first epitaxial layer 23 is performed by $AsCl_3$ carried in helium gas. However, in the case where a solid source of GaAs is employed, such as in the $GaAs/AsCl_3/H_2$ disproportionation reaction, there is insufficient chloride (HCl or $Cl_2$) available for etching. In such a case, the instantaneous injection technique may be advantageously employed to inject a precisely controlled amount of HCl gas to effect precision etching. The apparatus shown in FIG. 3 may then include a second injection valve at an appropriate location to introduce the HCl through conduct means 34 to the substrate 22.

EXAMPLE

Square wafers 1 in. on a side were positioned upright in a $Ga/AsCl_3/H_2$ vapor deposition reactor similar to that shown in FIG. 3. The deposition of the second epitaxial layer was preceded by an in situ etch of the GaAs substrate in $AsCl_3$/He and growth of a 4 μm thick $n^+$ buffer layer. An 8-port injection valve (Varian Aerograph model 57-000168-00) having two exchangeable sample loops was employed to inject the dopant. Turning the valve handle 55 by 90° results in an interchange of the contents of the two loops 52 and 54. The valve may be operated every few seconds without loss of doping control.

Typically, $H_2S$ having a volume of 0.7 ml at a concentration of 300 ppm and 2 atm pressure was injected once, corresponding to $n = 1.7 \times 10^{-8}$ moles and containing $1.0 \times 10^{16}$ S atoms. At a growth rate of 0.08 μm/min, this amount of $H_2S$ yielded highly-doped regions 28, and 29, both containing a charge Q of $2 \times 10^{12} \text{cm}^{-2}$.

Figure 4A:
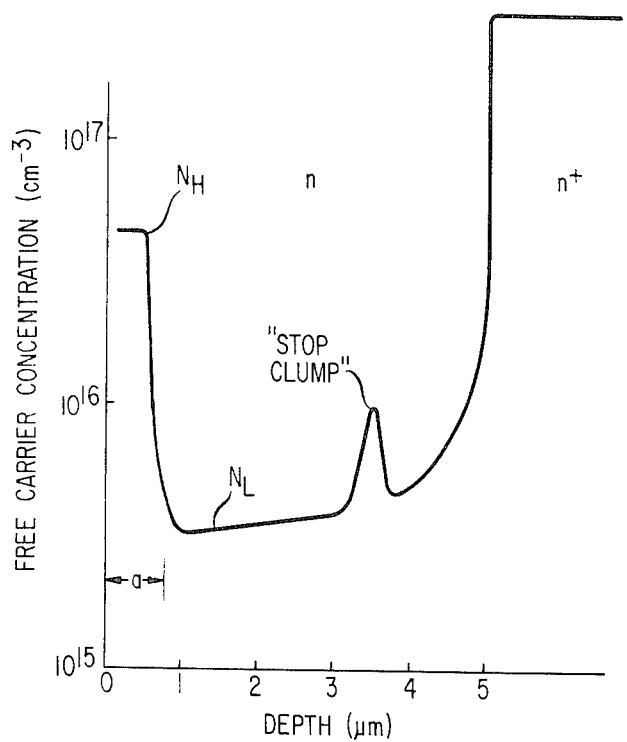
FIGS. 4A and 4B, on coordinates of doping level and distance into the active layer as measured from the rectifying barrier contact, are examples of doping profiles of GaAs slices fabricated in accordance with the invention.
Figure 4B:
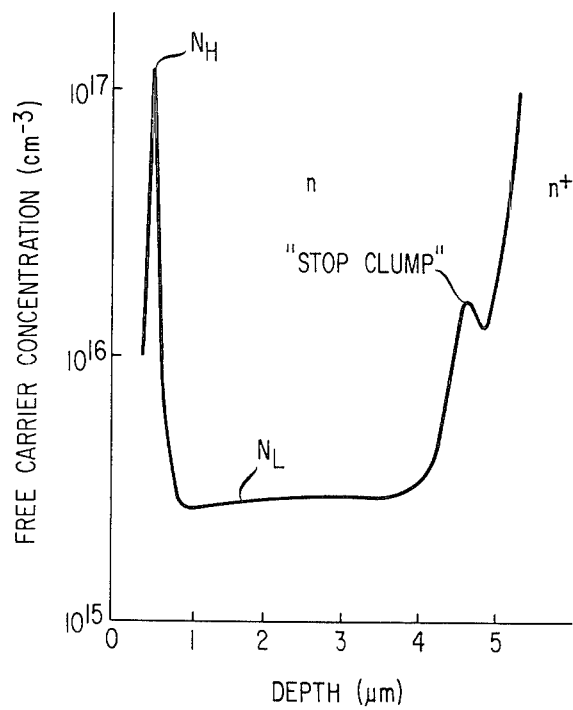

Typical doping profiles, measured on a conventional capacitance-voltage profilometer, are shown in FIGS. 4A and 4B. FIG. 4A depicts a hi-lo doping profile. The stop clump has a value of Qs, as determined from the C-V measurement, of $1 \times 10^{12} \text{cm}^{-2}$ and a thickness of about 0.35 μm. FIG. 4B depicts a lo-hi-lo profile. The stop clump has Qs of $2 \times 10^{12} \text{cm}^{-2}$ and a thickness of 0.5 μm.

After further processing the slices to fabricate IMPATT diodes from each slice, the measurements shown in the accompanying Table were obtained for the range of breakdown voltage, $V_b$ operating frequency, $f$, microwave efficiency, N, and average d.c. input power at failure.

The Table compares these Read IMPATT diodes with the lo-hi-lo doping profile plus a stop clump and two uniformly-doped slices, one having a breakdown voltage of 80 volts and the other a breakdown voltage of 100 volts. Control over breakdown voltage, and thus the device operating frequency for a uniformly-doped depletion region, is controlled by the doping alone. Since for the uniform doped IMPATT, $f \sim W^{-1}$ (more exactly $W^{-0.8}$) a high voltage resulting from a relatively low doped layer necessarily results in a low frequency device. It is seen in the Table that the frequency deviation is less for the lo-hi-lo devices including a stop clump than for devices without it. This is true even though in general the frequency of non-uniformly doped devices is more difficult to control.

Comparison of frequency control non-uniformly doped depletion region with and without stop clump is difficult at this time, since in many instances the buffer layer acts as a stop for the depletion layer. The distance between the stop clump intentionally added and the buffer layer is too narrow to permit direct comparison. It is expected that a deliberate increase in the epi thickness without the use of the stop clump would result in large variations in both frequency and voltage.

TABLE

| Sample | Profile | $V_B$ (Volts) | Operating Frequency (GHz) | Ave N(%) | Peak N(%) | Ave D. C. Input Power at Failure (Watts) |
|---|---|---|---|---|---|---|
| 1 | Lo-hi-lo | 78–100 | 6.0–5.2 | 11.7 | 17.2 | 23 |
| 2 | Uniform | 80 | ~7.2 | ~12 | ~14 | ~25 |
| 3 | Uniform | 100 | ~5.5 | ~12 | ~14 | ~25 |

What is claimed is:

1. A process for making a gallium arsenide diode comprising:
   a. epitaxially depositing at least one layer of gallium arsenide on the surface of a gallium arsenide substrate from materials including a source of gallium, a source of arsenic, and a conductivity-type determining impurity;
   b. varying the amount of conductivity-type determining impurity during the epitaxial deposition in the following sequence:
      (1) raising the amount of impurity, (2) lowering the amount of impurity, and (3) raising the amount of impurity this sequence being timed such that a relatively thin region of the layer, ranging in thickness from 100 Angstroms to 0.5 $\mu$m, is deposited while the impurity level is raised, so as to form a layer having a first relatively thin region formed during step 1 and a second relatively thin region formed during step 3 both of which regions having an impurity concentration that is relatively high with respect to the bulk of the layer,
   c. forming an electrical contact to the gallium arsenide substrate; and
   d. forming a rectifying barrier contact on the deposited gallium arsenide layer.

2. The process of claim 1 in which the first thin region includes an amount of charge ranging from about $1 \times 10^{12}$ cm$^{-2}$ to $3 \times 10^{12}$ cm$^{-2}$.

3. The process of claim 1 in which:
   (a) two layers of gallium arsenide are epitaxially deposited in sequence on the gallium arsenide substrate from materials including gallium, arsenic trichloride and sulfur as an n-type determining impurity, the materials being transported to the substrate by a carrier gas, the first layer of gallium arsenide having a carrier concentration of about $1 \times 10^{17}$ cm$^{-3}$ to $1 \times 10^{18}$ cm$^{-3}$ and a thickness of about 2 $\mu$m to 6 $\mu$m, and the second layer of gallium arsenide having a carrier concentration of $1 \times 10^{15}$ cm$^{-3}$ to $1 \times 10^{16}$ cm$^{-3}$ and a thickness ranging from 4 $\mu$m to 8 $\mu$m;
   (b) the first thin region of gallium arsenide is formed during deposition of the second gallium arsenide layer by injecting substantially simultaneously at constant pressure a constant volume of a gas containing from 100 ppm to 1000 ppm H$_2$S/H$_2$, the region ranging in thickness from about 100 Angstroms to 0.5 $\mu$m and including an amount of charge ranging from about $1 \times 10^{12}$ cm$^{-2}$ to 3.5 $\times 10^{12}$ cm$^{-2}$;
   (c) the second thin region of gallium arsenide is formed by injecting substantially instantaneously at constant pressure a constant volume of a gas containing from 100 ppm to 1000 ppm H$_2$S/H$_2$, the thin film ranging in thickness from 0.01 $\mu$m to 0.5 $\mu$m and including a carrier charge ranging from $2 \times 10^{12}$ cm$^{-2}$ to $3.5 \times 10^{12}$ cm$^{-2}$;
   (d) forming an ohmic contact on a second surface of the gallium arsenide substrate; and
   (e) forming a Schottky barrier contact on the second gallium arsenide layer.

4. The process of claim 1 in which the sequence through which the amount of conductivity-type determining impurity is varied includes the additional step of 4) lowering the amount of impurity, so that the two thin regions are bounded on both sides by regions of the layer with relatively lower concentration of impurity.

5. The process of claim 4 in which the first thin region includes an amount of charge ranging from about $1 \times 10^{12}$ cm$^{-2}$ to $3 \times 10^{12}$ cm$^{-2}$.

6. The process of claim 4 in which:
   (a) two layers of gallium arsenide are epitaxially deposited in sequence on the gallium arsenide substrate from materials including gallium, arsenic trichloride and sulfur as an n-type determining impurity, the materials being transported to the substrate by a carrier gas, the first layer of gallium arsenide having a carrier concentration of about $1 \times 10^{17}$ cm$^{-3}$ to $1 \times 10^{18}$ cm$^{-3}$ and a thickness of about 2 $\mu$m to 6 $\mu$m, and the second layer of gallium arsenide having a carrier concentration of $1 \times 10^{15}$ cm$^{-3}$ to $1 \times 10^{16}$ cm$^{-3}$ and a thickness ranging from 4 $\mu$m to 8 $\mu$m;
   (b) the first thin region of gallium arsenide is formed during deposition of the second gallium arsenide layer by injecting substantially simultaneously at constant pressure a constant volume of a gas containing from 100 ppm to 1000 ppm H$_2$S/H$_2$, the region ranging in thickness from about 100 Angstroms to 0.5 $\mu$m and including an amount of charge ranging from about $1 \times 10^{12}$ cm$^{-2}$ to $3.5 \times 10^{12}$ cm$^{-2}$; (c) the second thin region of gallium arsenide is formed by injecting substantially instantaneously at constant pressure a constant volume of a gas containing from 100 ppm to 1000 ppm H$_2$S/H$_2$, the thin film ranging in thickness from 0.01 μm to 0.5 μm and including a carrier charge ranging from $2 \times 10^{12}$ cm$^{-2}$ to $3.5 \times 10^{12}$ cm$^{-2}$;

(d) forming an ohmic contact on a second surface of the gallium arsenide substrate; and (e) forming a Schottky barrier contact on the second gallium arsenide layer.

* * * * *